United States Patent
Hirose et al.

(10) Patent No.: US 12,494,383 B2
(45) Date of Patent: Dec. 9, 2025

(54) GAS SUPPLY DEVICE AND SEMICONDUCTOR MANUFACTURING APPARATUS

(71) Applicants: Tokyo Electron Limited, Tokyo (JP); FUJIKIN INCORPORATED, Osaka (JP)

(72) Inventors: Jun Hirose, Miyagi (JP); Atsushi Sawachi, Miyagi (JP); Takahiro Matsuda, Osaka (JP); Kazunari Watanabe, Osaka (JP); Kohei Shigyou, Osaka (JP); Taiki Hoshiko, Osaka (JP)

(73) Assignees: TOKYO ELECTRON LIMITED, Tokyo (JP); FUJIKIN INCORPORATED, Osaka (JP)

( * ) Notice: Subject to any disclaimer, the term of this patent is extended or adjusted under 35 U.S.C. 154(b) by 224 days.

(21) Appl. No.: 18/279,712

(22) PCT Filed: Mar. 4, 2022

(86) PCT No.: PCT/JP2022/009314
§ 371 (c)(1),
(2) Date: Aug. 31, 2023

(87) PCT Pub. No.: WO2022/196386
PCT Pub. Date: Sep. 22, 2022

(65) Prior Publication Data
US 2024/0242976 A1    Jul. 18, 2024

(30) Foreign Application Priority Data
Mar. 19, 2021   (JP) ................ 2021-045537

(51) Int. Cl.
*H01L 21/67* (2006.01)
*H01L 21/02* (2006.01)
*C23C 16/455* (2006.01)

(52) U.S. Cl.
CPC ........ *H01L 21/67017* (2013.01); *H01L 21/02* (2013.01); *C23C 16/45561* (2013.01); *Y02E 60/50* (2013.01)

(58) Field of Classification Search
CPC ... H01L 21/67017; H01L 21/02; Y02E 60/50; C23C 16/45561
See application file for complete search history.

(56) References Cited

U.S. PATENT DOCUMENTS 5,470,390 A * 11/1995 Nishikawa .............. B01F 23/19
118/715
6,071,349 A *  6/2000 Kurosawa ............. C23C 16/455
118/715
(Continued)

FOREIGN PATENT DOCUMENTS

JP    10-28855       2/1998
JP    2988949 B2 *  12/1999
(Continued)

OTHER PUBLICATIONS

International Search Report Issued in International Patent Application No. PCT/JP2022/009314, dated May 24, 2022, along with an English translation thereof.

*Primary Examiner* — Marina A Tietjen
(74) *Attorney, Agent, or Firm* — Greenblum & Bernstein, P.L.C.

(57) ABSTRACT

A gas supply device capable of saving space and supplying a mixed gas having components with stable concentration to a processing chamber in a short time includes: a plurality of fluid control units each including a flow path through which gas flows, and fluid control devices provided in the middle of the flow path; a merging flow path including a plurality of connecting portions fluidly connected to the plurality of fluid control units and a single gas outlet portion which derives the gas introduced through the plurality of connect- (Continued)

ing portions; wherein a plurality of connecting portions is arranged symmetrically with respect to the gas outlet portion in the flow path direction of the merging flow path, and two or more fluid control units are fluidly connected to each of the plurality of connecting portions.

5 Claims, 6 Drawing Sheets

(56) References Cited

U.S. PATENT DOCUMENTS

| | | |
|---|---|---|
| 10,022,689 B2 | 7/2018 | Shareef et al. |
| 2009/0320754 A1 | 12/2009 | Oya et al. |

FOREIGN PATENT DOCUMENTS

| | | |
|---|---|---|
| JP | 5037510 | 9/2012 |
| JP | 2018-88336 | 6/2018 |
| JP | 2018-98387 | 6/2018 |
| JP | 2019-152234 | 9/2019 |
| WO | 2008/023711 A1 | 2/2008 |

\* cited by examiner

|  | Flow path length (Internal volume) |
| --- | --- |
| Valve V2 to Chamber 100 | A1=B1=C1=D1=E1=F1=G1=H1 |
|  | A2=B2=C2=D2=E2=F2=G2=H2 |

| | Flow path length (Internal volume) |
|---|---|
| Valve V2 to Chamber 100 | A2=A3=B1=B2=C1=C2=D1=D2=E1=F1=F2=G1=G2=H3=H4 |
| | A1=A4=H2=H5 |
| | H1=H6 |

[fig.5]

GAS SUPPLY DEVICE AND SEMICONDUCTOR MANUFACTURING APPARATUS

TECHNICAL FIELD

The present invention relates to a gas supply device used in a semiconductor manufacturing apparatus or the like and to a semiconductor manufacturing apparatus.

BACKGROUND ART

In various manufacturing processes such as a semiconductor manufacturing process, in order to supply a gas obtained by mixing a plurality of accurately measured process gases to a processing chamber, a gas supply device called a gas box in which a fluid control device is stored in a box is used (see, for example, Patent Literature 1 and 2).

In a conventional fluid control device, a fluid control unit is configured for each gas, and these fluid control units are arranged in parallel (see Patent Literature 3 and the like). Each fluid control unit is provided with various fluid control devices such as open-close valves, regulators, and mass flow controllers. The outlet-side flow path of each fluid control unit is connected to a manifold block, where a plurality of process gases is merged, and the mixed gas is led out from one end of the manifold block and supplied to a processing chamber.

PRIOR ART

Patent Literature

PTL 1: Japanese Laid-Open Patent Application No. 2018-98387
PTL 2: Japanese Laid-Open Patent Application No. 2018-88336
PTL 3: Japanese Laid-Open Patent Application No. 2019-152234
PTL 4: U.S. Pat. No. 10,022,689
PTL 5: Japanese Patent No. 5037510

SUMMARY OF INVENTION

Technical Problem

In semiconductor manufacturing apparatus, it is required to supply a mixed gas having components with stable concentrations from a gas supply device to a process chamber in a short time.

However, in the fluid control device having a conventional structure described above, since a plurality of fluid control units are arranged in parallel and the outlet-side flow path is connected to the manifold block, and the flow path length from each fluid control unit to the process chamber is different, it is difficult to supply a mixed gas having components with stable concentration from the gas supply device to the process chamber in a short time.

Patent Literatures 4 and 5 propose a technique of arranging a plurality of fluid control units radially to equalize flow path length up to the processing chamber of the fluid control unit, but the installation space of the fluid control device is large and it is difficult to save the space.

The present invention has been made in view of the above problems, and an object thereof is to provide a gas supply device and a semiconductor manufacturing apparatus capable of space-saving and capable of supplying a mixed gas having components with stable concentrations to a process chamber in a short time from a gas supply device.

Solution to Problem

A gas supply device according to a first aspect of the present invention comprises:
 a plurality of fluid control units each including a flow path through which a gas flows from an upstream side to a downstream side, and a fluid control device which is provided in the middle of the flow path and controls a flow of the gas flowing through the flow path;
 a merging flow path including a plurality of connecting portions fluidly connected to the plurality of fluid control units, and a single gas outlet portion that leads out the gas introduced through the plurality of connecting portions;
 wherein the plurality of connecting portions is arranged symmetrically with respect to the gas outlet portion in the flow path direction of the merging flow path, and two or more of the fluid control units are fluidly connected to each of the plurality of connecting portions.

Preferably, the plurality of connecting portions is provided in the same plural number on one side and the other side of the gas outlet portion, respectively, in flow path direction of the merging flow path.

Preferably, the merging flow path has open-close valves provided in the vicinities of both sides of the gas outlet portion, respectively, and is configured so that an upstream side of each open-close valve can be isolated from other portions.

A gas supply device according to the second aspect of the present disclosure comprises:
 a plurality of fluid control units each including a flow path through which a gas flows from an upstream side to a downstream side, and a fluid control device which is provided in the middle of the flow path and controls a flow of the gas flowing through the flow path; a tournament-like connecting flow path that is fluidly connected to the plurality of fluid control units, introduces a gas discharged from the plurality of fluid control units, merges the gas in a tournament shape, and discharges the gas to the outside; and
 the tournament-like connecting flow path comprises: $2^N$ of first stage partial flow paths (N is an integer equal to or greater than 2) each having an inlet connectable to the fluid control unit;
 k-th stage partial flow paths each formed by merging two k−1-th stage partial flow paths (k is an integer from 2 to N);
 a (N+1)-th stage partial flow path formed by merging the N-th stage partial flow paths and having an outlet for outputting the gases to the outside;
 wherein flow path lengths or internal volumes of flow paths from the inlets to the outlet of the tournament-like connecting flow path are equal to or substantially equal to each other.

One or a plurality of the fluid control units are directly connected to the respective gas inlet ports of the tournament-like connecting flow path, or the plurality of the fluid control units are connected via a merging pipe that fluidly connects downstream sides of the fluid control units to each other.

Preferably, the tournament-like connecting flow path has an open-close valve provided in the vicinity of the upstream side of the merging point, and is configured to isolate the upstream sides of the respective open-close valves from other portions.

A semiconductor manufacturing apparatus of the present invention uses the above-described gas supply device for controlling supply of a process gas in a manufacturing process of a semiconductor device, that requires a process step by the process gas in a sealed processing chamber.

Advantageous Effects of Invention

According to the first aspect of the present invention, the connecting portion of the merging flow path for merging the plurality of gases and the plurality of fluid control units is arranged symmetrically with respect to the arrangement position of the gas outlet portion in flow path direction of the merging flow path, and each of the plurality of connecting portions is configured to fluidly connect two or more of the fluid control units. Accordingly, flow path lengths of flow paths up to processing chamber from the plurality of fluid control units connected to connecting portion of the symmetrical arrangement can be made equal, and it is possible to save space, and a mixed gas having components with stable concentration can be supplied to the processing chamber in a short time.

According to the second aspect of the present invention, by using a tournament-like connecting flow path whose flow path lengths or the inner volumes from the inlet ports to the outlet ports are equal to or substantially equal to each other, gases discharged from the plurality of fluid control units are introduced and merged in a tournament-like manner and discharged to the outside, so that the flow path length from the plurality of fluid control units to the processing chamber can be made equal, thereby saving space and a mixed gas having components with stable concentration can be supplied to the processing chamber in a short time.

BRIEF DESCRIPTION OF DRAWINGS

FIGS. 6(a) and 6(b) are schematic diagrams showing an example of flow path switching of another gas supply device according to the third embodiment of the present invention, wherein FIG. 6(a) shows an example of configuration at a development stage, and FIG. 6(b) shows an example of configuration at a mass production stage.

DESCRIPTION OF EMBODIMENTS

Hereinafter, embodiments of the present invention will be described with reference to the drawings.

First Embodiment

Figure 1:
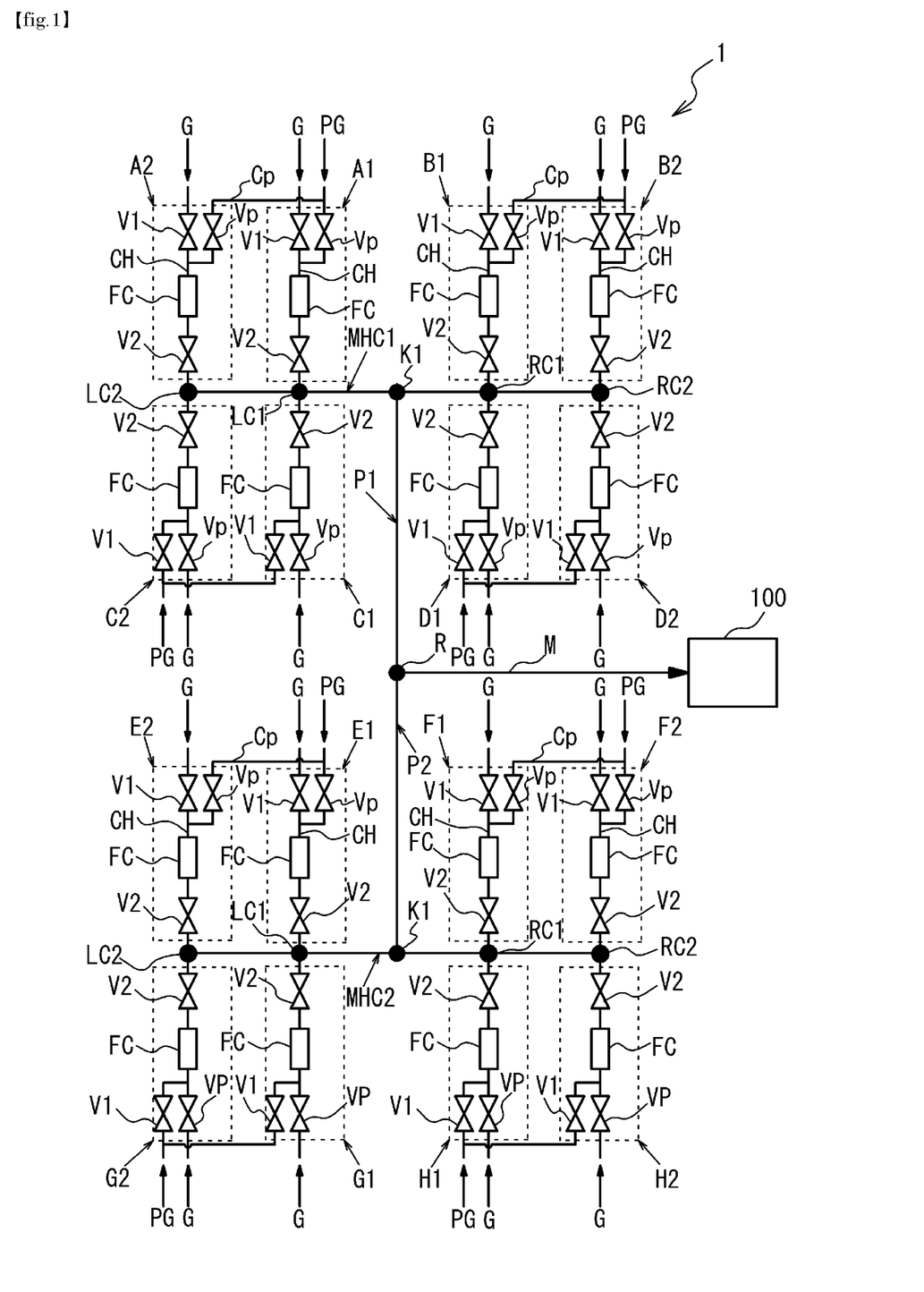
FIG. 1 is a schematic configuration diagram of a gas supply device according to a first embodiment of the present invention.

FIG. 1 shows a schematic configuration of a gas supply device 1 according to a first embodiment of the present invention.

The gas supply device 1 comprises a plurality of fluid control units A1 to H2, a plurality of merging flow paths MHC1 and MHC2, a single main flow path M and a plurality of connecting flow paths P1 and P2. By applying the gas supply device 1 to a processing chamber 100, a semiconductor manufacturing apparatus according to an embodiment of the present disclosure is configured.

Each of the fluid control units Alto H2 includes a flow path CH, an open-close valve V1, a flow rate controller FC, an open-close valve V2, a flow path Cp, and an open-close valve Vp. The open-close valve V1, the flow rate controller FC and the open-close valve V2 are located in the middle of the flow path CH, the open-close valve Vp is located in the middle of the flow path Cp for the purge-gas PG, and the flow path Cp is fluidly connected to the flow path CH at a point between the open-close valve V1 and the flow rate controller FC.

A process gas G is supplied to each flow path CH from the upstream side, and a purge gas PG is supplied to the flow path Cp from the upstream side. The types of process gases G supplied to the fluid control units A1 to H2 may differ from each other or may be the same. The flow path CH or the flow path Cp can be formed by a piping or a block.

Open-close valves V1, V2 open and close the flow path CH, and the open-close valve Vp opens and closes the flow path Cp.

The flow rate controller FC is composed of, for example, a mass flow controller or the like, and controls the flow rate of gases flowing from the upstream side to the downstream side of the flow path CH.

The open-close valve V1, the flow rate controller FC, the open-close valve V2, and the open-close valve Vp are examples of the fluid control device of the present invention, and the "fluid control device" of the present invention is a device used for fluid control that controls the flow of gases, and includes, but is not limited to, an open-close valve (two-way valve), a regulator, a pressure gauge, an open-close valve (three-way valve), a mass flow controller, and the like. Further, in the present embodiment, each of the fluid control units A1 to H2 has the same configuration, but the present invention is not limited thereto, and may have different configurations from each other. And fluid devices that do not control the fluid, such as a pressure gauge, can be included in each of the fluid control units Alto H2. The components of the fluid control units A1 to H2 are preferably arranged in a row from the upstream side to the downstream side, and the fluid control units A1 to H2 are preferably arranged in parallel. Furthermore, the fluid control units A1 to H2 are preferably arranged in a direction perpendicular to the merging flow paths MHC1, MHC2. With such an arrangement, it is possible to minimize the space required for the arrangement of the plurality of fluid control units A1 to H2.

The merging flow paths MHC1, MHC2 are flow paths with both ends closed, and are formed of pipes, manifold blocks, or the like, and preferably have the same construction and dimensions.

The merging flow paths MHC1, MHC2 has a plurality of connecting portions LC1 to RC2 to which the downstream ends of the respective flow paths CH of the plurality of fluid control units A1 to H2 are fluidly connected, and a single gas outlet portion K1 for outputting the mixed gas merged in the merging flow path MHC1.

The gas outlet portions K1 of the merging flow paths MHC1, MHC2 are arranged at the central positions in the flow directions of the merging flow paths MHC1, MHC2. The merging flow paths MHC1, MHC2 may be each formed in a straight line, but may be curved as long as it is symmetrical with respect to the central position.

Connecting portions LC1 to RC2 of the merging flow paths MHC1, MHC2 are arranged at symmetrical positions with respect to the flow path center position. That is, the plurality of connecting portions LC1 to RC2 are arranged symmetrically with respect to the gas outlet portion K1. The Connecting portions LC1, RC1 and connecting portions LC2, RC2 are arranged at symmetrical positions. That is, the same plural number of the connecting portions LC1 to RC2 are provided on one side and the other side of the gas outlet portion K1, respectively, in flow path direction of the merging flow paths MHC1, MHC2.

(The portions from the gas outlet portion K1 to the connecting portions LC1, RC1 on both sides in each of the merging flow paths MHC1, MHC2 are also referred to as first stage partial flow paths T1, and the portions on both sides thereof are also referred to as merging pipes J.)

The fluid control units A1 and C1 are fluidly connected to the connecting portion LC1 of the merging flow path MHC1, the fluid control units A2, C2 are fluidly connected to the connecting portion LC2 of the merging flow path MHC1, the fluid control units B1, D1 are fluidly connected to the connecting portion RC1 of the merging flow path MHC1, and the fluid control units B2, D2 are fluidly connected to the connecting portion RC2 of the merging flow path MHC1.

Similarly, fluid control units E1, G1 are connected to the connecting portion LC1 of the merging flow path MHC2, fluid control units E2, G2 are connected to the connecting portion LC2 of the merging flow path MHC2, fluid control units F1, H1 are connected to the connecting portion RC1 of the merging flow path MHC2, and fluid control units F2, H2 are connected to the connecting portion RC2 of the merging flow path MHC2.

The two flow paths CH connected to each of connecting portions LC1 to RC2 may be connected so as to face each other or may be connected so as to face different directions. In the present embodiment, the case in which two fluid control units are connected to each of the connecting portions LC1 to RC2 of the merging flow paths MHC1, MHC2 has been described as an example, but the present invention is not limited thereto, and three or more fluid control units can be fluidly connected to each of the connecting portions LC1 to RC2.

Gas outlet portions K1 of the merging flow paths MHC1, MHC2 are fluidly connected to the merging portion R of the main flow path M by connecting flow paths P1, P2, respectively. The connecting flow paths P1, P2 are preferably formed of pipes or the like having the same construction and dimensions.

The main flow path M is a flow path for supplying a mixed gas of a plurality of process gases G or supplying a purging gas PG to the processing chamber 100, and is formed of a piping or the like.

Here, the merging flow paths MHC1, MHC2 are arranged symmetrically with respect to the merging portion R of the main flow path M. The symmetrical arrangement of the merging flow paths MHC1, MHC2 includes left-right symmetrical arrangement, vertical symmetrical arrangement, plane symmetrical arrangement, and line symmetrical arrangement with respect to the merging portion R, and any of these arrangements may be used. Further, it may be point-symmetric with respect to the center point of the merging portion R. In the present embodiment, two merging flow paths MHC1, MHC2 are illustrated, but three or more merging flow paths may be provided, in which case the three or more merging flow paths are arranged point-symmetrically with respect to the center point of the merging portion R.

By arranging a plurality of connecting portions LC1 to RC2 symmetrically with respect to the gas outlet portion K1, the length of the flow path from the connecting portion LC1 to the gas outlet portion K1 and the length of the flow path from the connecting portion RC1 to the gas outlet portion K1 can be made equal, and the length of the flow path from the connection portion LC2 to the gas outlet portion K1 and the length of the flow path from the connecting portion RC2 to the gas outlet portion K1 can be made equal.

In addition, by arranging the merging flow paths MHC1, MHC2 symmetrically with respect to the merging portion R of the main flow path M, the length of the flow path from the gas outlet portion K1 of the merging flow path MHC1 to the merging portion R of the main flow path M and the length of the flow path from the gas outlet portion K1 of the merging flow path MHC2 to the merging portion R of the main flow path M can be made equal.

Figure 2:
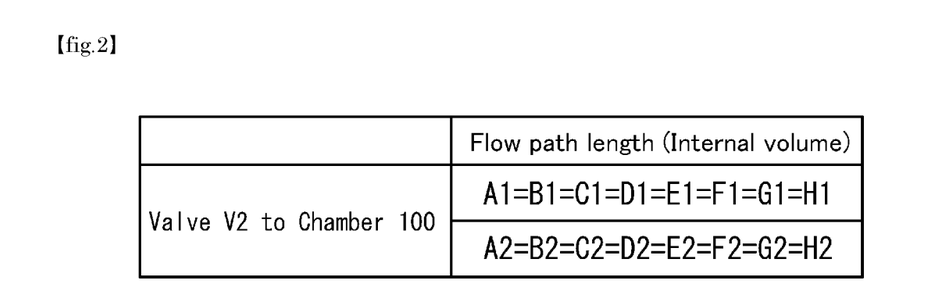
FIG. 2 is a chart illustrating the relationship of flow path lengths to the processing chamber from fluid control units of the gas supply device in FIG. 1.

With the above-described configuration of the gas supply device 1, as shown in FIG. 2, the flow path lengths (or internal volumes) of flow paths from the open-close valves V2, which are fluid control devices arranged on the most downstream side of the flow paths CH of the plurality of fluid control units A1, B1, C1, D1, E1, F1, G1, H1, to the processing chamber 100 can be made equal, and the flow path lengths (or internal volumes) of flow paths from the open-close valves V2, which are fluid control devices arranged on the most downstream side of the flow paths CH of the plurality of fluid control units A2, B2, C2, D2, E2, F2, G2, H2, to the processing chamber 100 can be made equal.

If all the fluid control units A1 to H2 are arranged in parallel, although the flow path lengths from open-close valves V2 to the processing chamber 100 are different, in this embodiment, it is possible to equalize the flow path lengths from open-close valves V2 of the fluid control units that are symmetrically arranged to the processing chamber 100.

As a consequence, the space of the gas supply device 1 can be reduced, and the mixed gas having components with stable concentration can be supplied from the gas supply device 1 to the processing chamber 100 in a short time.

Further, according to the present embodiment, compared to the case in which all the fluid control units A1 to H2 are arranged in parallel, the flow path lengths from the fluid control units A1 to H2 up to the processing chamber 100 can be shortened.

In the above embodiment, the case in which two merging flow paths MHC1, MHC2 are provided has been described, but the present invention is not limited thereto, and a case in which only one merging flow path MHC1 is used is also included in the embodiment of the present invention.

Second Embodiment

Figure 3:
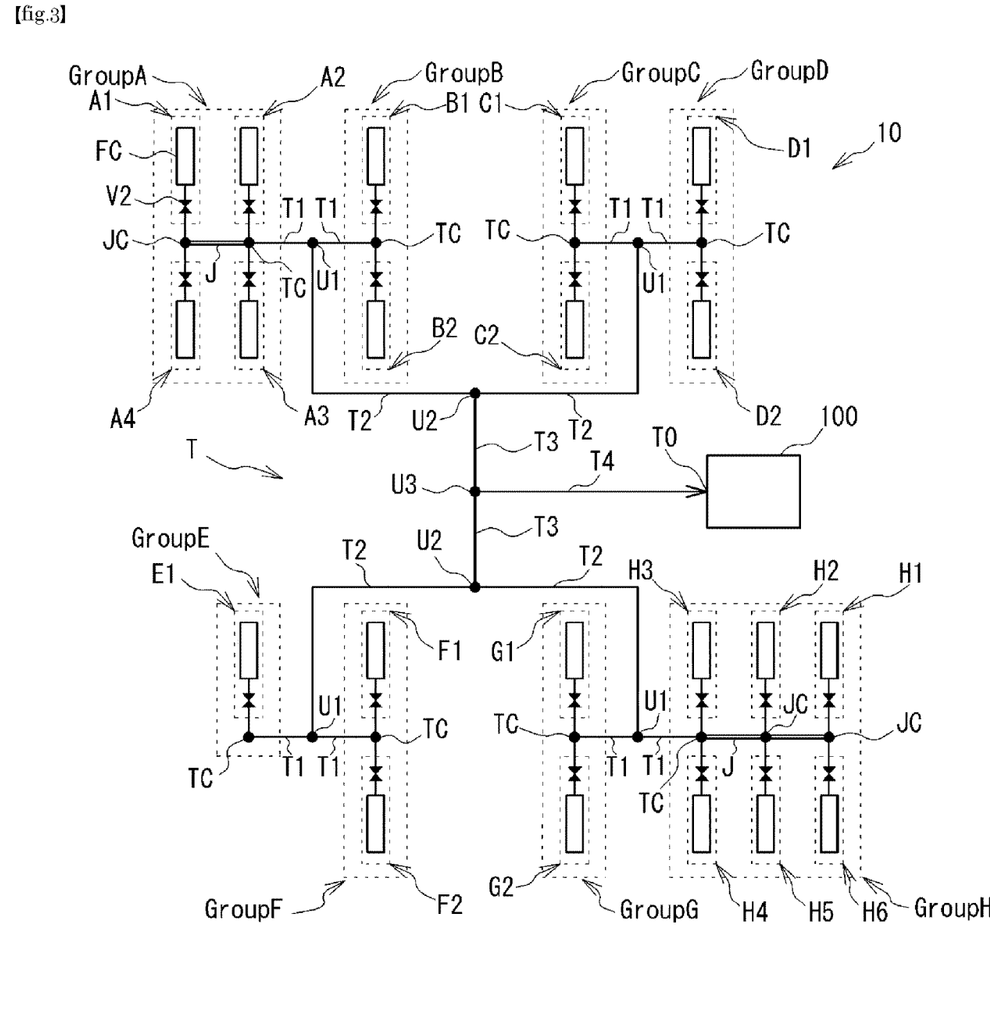
FIG. 3 is a schematic configuration diagram of the gas supply device according to a second embodiment of the present invention.

FIG. 3 is a schematic configuration diagram of a gas supply device 10 according to a second embodiment of the present invention.

The present embodiment uses a tournament-like connecting flow path T whose flow path lengths or internal volumes from inlets TC to the outlets TO are equal to or substantially equal to each other, and the gases discharged from the plurality of fluid control units A1 to H6 are introduced and merged in a tournament manner to be discharged to the outside.

The gas supply device 10 of the present embodiment is composed of fluid control units A1 to H6, a tournament-like connecting flow path T, and a merging pipe J.

The fluid control units A1 to H6 are similar to the fluid control units A1 to H2 of the first embodiment, and each includes a flow path CH, an open-close valve V1 (both shown in FIG. 1), a flow rate controller FC, an open-close valve V2, and an open-close valve Vp (shown in FIG. 1), and opens and closes the flow path CH and controls a flow rate of gases flowing through the flow path CH from the upstream side to the downstream side. In FIG. 3, for the sake of simplicity, the illustration of the flow path CH, the open-close valve V1, and the open-close valve Vp are omitted, and the flow rate controller FC and the open-close valve V2 are illustrated only for the fluid control unit A1.

The tournament-like connecting flow path T is a tournament-like flow path having N+1 stages of partial flow paths including:

$2^N$ of first stage partial flow paths T1 (N is an integer greater than or equal to 2) having an inlet TC connectable to each of the fluid control units A1 to H6, k-th stage partial flow paths Tk each formed by merging two of k−1-st stage partial flow paths Tk−1 (k is an integer of 2 to N), a N+1-st stage partial flow path TN+1 formed by merging N-th stage partial flow paths TN and having an outlet TO for outputting gases to the outside.

In addition, flow path lengths (or internal volumes) from the respective inlets TC to the outlet TO of the tournament-like connecting flow path T are formed to be (substantially) equal to each other.

This configuration can be realized, for example, by (substantially) equalizing flow path lengths of all partial flow paths Tk (k is an integer from 1 to N) for each stage and forming flow paths with the same inner diameter.

The tournament-like connecting flow path T of the present embodiment is an example of N=3, and includes eight first stage partial flow paths T1, four second stage partial flow paths T2 each formed by joining two first stage partial flow paths T1 at the merging portion U1, two third stage partial flow paths T3 each formed by joining two second stage partial flow paths T2 at the merging portion U2, and a fourth stage partial flow path T4 formed by joining the two third stage partial flow paths T3 at the joining portion U3.

Flow paths T1 to T4 may be formed of pipes or manifolds or flow path blocks. In addition, it is preferable that flow path diameters of all the partial flow paths for each stage are equal.

The inlet TC is provided at the upstream end of each first stage partial flow path T1 and is configured so that one or a plurality of fluid control units A1 to H6 can be connected to each inlet TC either directly or via a merging pipe J. The merging pipe J is a pipe that fluidly connects the downstream sides of the plurality of fluid control units to each other, and corresponds to the outer part of the connecting portions LC1, RC1 of the merging flow path MHC1 or MHC2 of the first embodiment.

In FIG. 3, the fluid control units A1 to H6 are shown in groups A to H connected to the respective inlets TC.

In group A, the fluid control units A2 and A3 are directly connected to the inlet TC, and the fluid control units A1 and A4 are connected to the inlet TC via a merging pipe J. In addition, in the group H, the fluid control units H3 and H4 are directly connected to the inlet TC, and the fluid control units H1, H2, H5 and H6 are connected to the inlet TC via a merging pipe J.

On the other hand, in group B, the fluid control units B1 and B2 are directly connected to the inlet TC, and in groups C, D, F and G as well, two fluid control units are directly connected to the inlet TC in the same manner. In group E, one fluid control unit E1 is directly connected to the inlet TC.

As described above, since flow path lengths (or internal volumes) from the respective inlets TC to the outlet TO of the tournament-like connecting flow path T are formed to be (substantially) equal to each other, flow path lengths from the fluid control units A2, A3, B1, B2, C1, C2, D1, D2, E1, F1, F2, G1, G2, H3 and H4 directly connected to the respective inlets TC to the outlet TO are (substantially) equal to each other.

In addition, if the distance from the inlet TC to the connecting portion JC of the merging pipe J in the group A is the same as the distance from the inlet TC to the first connecting portion JC of the merging pipe J in the group H, flow path lengths from the fluid control units A1, A4, H2 and H5 connected to connecting portions JC to the outlet TO are (substantially) equal to each other.

Figure 4:
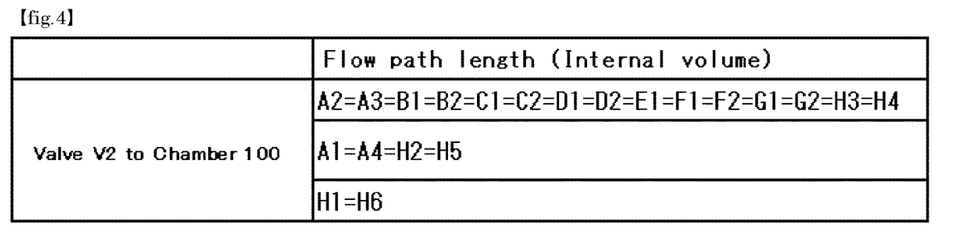
FIG. 4 is a chart illustrating the relationship of flow path lengths to the processing chamber from fluid control units of the gas supply device in FIG. 3.

FIG. 4 is a diagram for explaining the relation among flow path lengths from the fluid control units A1 to H6 to the processing chamber 100 (outlet TO) of the gas supply device in FIG. 3.

Thus, in the present embodiment, like the first embodiment, it is possible to equalize the flow path lengths from open-close valves V2 of symmetrically arranged fluid control units to the processing chamber 100, it is possible to shorten the flow path lengths from the control units A1 to H2 to the processing chamber 100 compared to a case in which all the fluid control units A1 to H6 are arranged in parallel. As a consequence, the space of the gas supply device 10 can be reduced, and a mixed gas having components with stable concentration can be supplied from the gas supply device 10 to the processing chamber 100 in a short time.

In the above embodiment, a case has been described in which 21 fluid control units A1 to H6 are connected to a tournament-like flow path having the number of stages N=3, but the present invent is not limited thereto. By increasing the number of stages N of the tournament-like connecting flow path T, more fluid control units can be connected while keeping flow path lengths up to processing chamber 100 equal.

Relationship Between the First Embodiment and the Second Embodiment

The first embodiment shown in FIG. 1 corresponds to a tournament-like connecting flow path of N=2 in the second embodiment. That is, the portions from each gas outlet portion K1 of the merging flow paths MHC1, MHC2 to the connecting portions LC1, RC1 on both sides of the first embodiment correspond to the first stage partial flow paths T1, the portions on both sides of them respectively correspond to the merging pipes J, the connecting portions LC2, RC2 correspond to the connecting portions JC, the connecting flow paths P1, P2 respectively correspond to the second stage partial flow paths T2, and the main flow path M corresponds to the third stage partial flow path T3.

Third Embodiment

Figure 5:
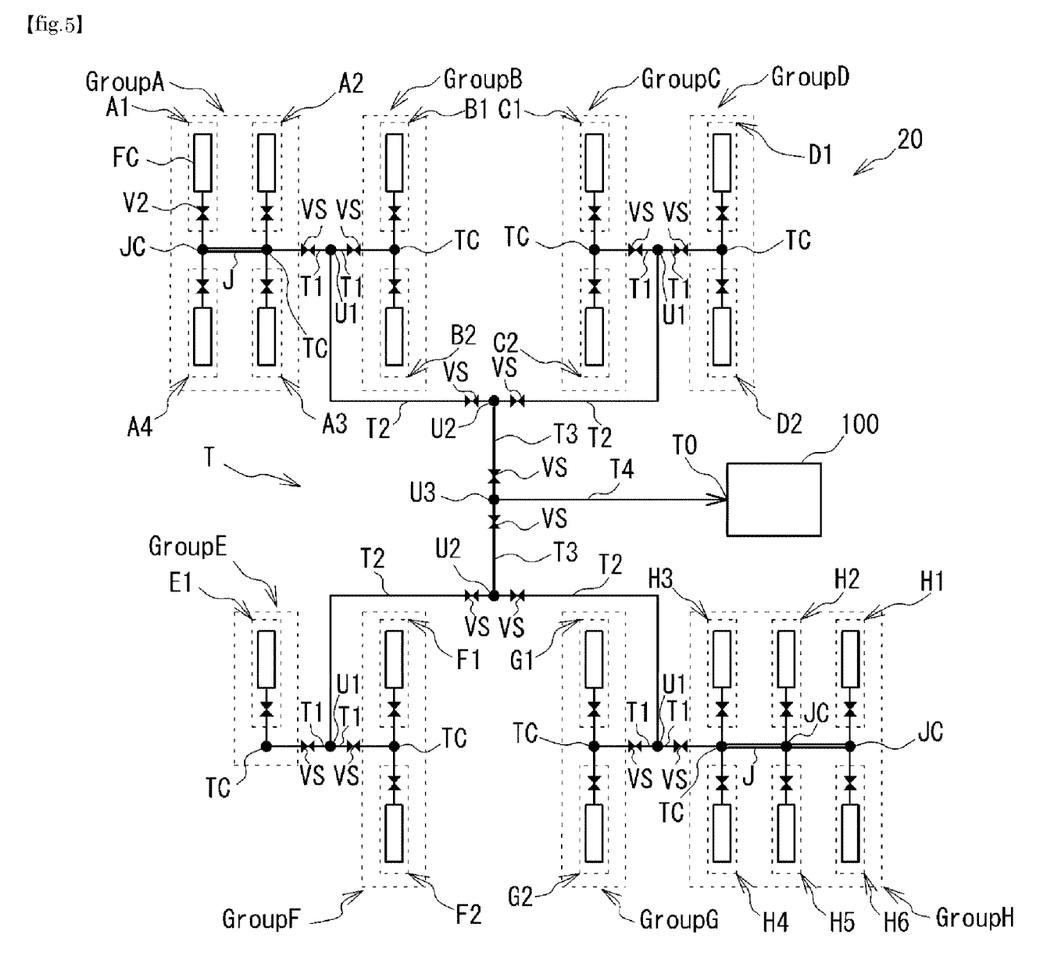
FIG. 5 is a schematic configuration diagram of the gas supply device according to a third embodiment of the present invention.

FIG. 5 is a schematic configuration diagram of a gas supply device 20 according to the third embodiment of the present invention.

This embodiment is one in which open-close valves VS are provided in the vicinities of the upstream sides of the merging portions U1, U2, U3 of the tournament-like connecting flow path T in the second embodiment, and the upstream sides of the open-close valves VS can be isolated from other portions.

Without the open-close valves VS, for example, when the group A (fluid control units A1~A4) is not used, flow paths from the merging portion U1 downstream of the group A to the respective open-close valves V2 of the fluid control units A1 to A4 become so-called cecum plumbing (dead space), and residual gas or the like present there may cause a problem that it takes longer time to switch the type of process gas supplied to the process chamber 100 or to purge it.

Examples of such cases in which any one of the groups A to H of the fluid control units is not used include the following cases.
1) A case in which the gas supply device 20 is configured to flow different process gases for groups A to H, and any of the groups is no longer used because a certain process gas is no longer used due to process change.
2) A case in which a group included in the configuration at a development stage of a process equipment including the gas supply device 20 is deleted at a mass production stage of the process equipment. In this case, if the piping system at the development stage is diverted to the process equipment at the mass production stage, the part connected to the deleted group becomes a cecum plumbing.

In the present embodiment, since the open-close valves VS are provided in the vicinities of the upstream sides of the merging portions U1, U2, U3, respectively, by closing the open-close valves VS on the upstream sides of the merging portions U1, U2, U3 downstream of the groups that are not used, the piping systems on the upstream sides of the open-close valves VS can be isolated from other portions, thereby preventing the formation of the cecum plumbing.

These open-close valves VS (also referred to as partition valves) may be automated valves, but may be manual valves if the frequency of opening and closing is low. In addition, these open-close valves VS should be placed as close as possible to the merging portions U1, U2, U3 in order to prevent the occurrence of cecum plumbing.

Figure 6A:
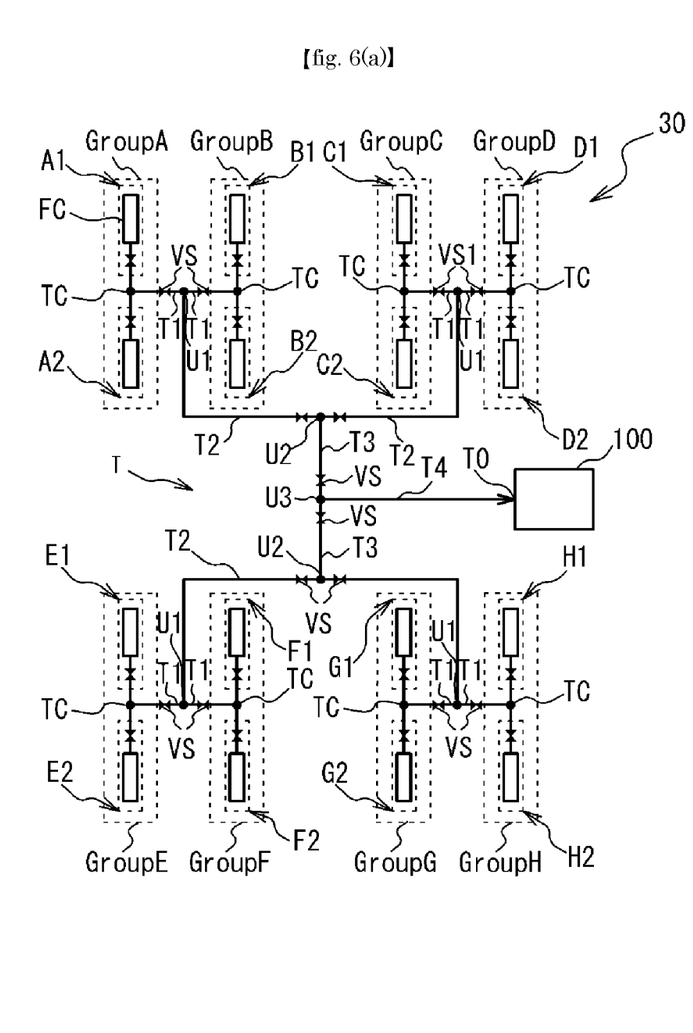
Figure 6B:
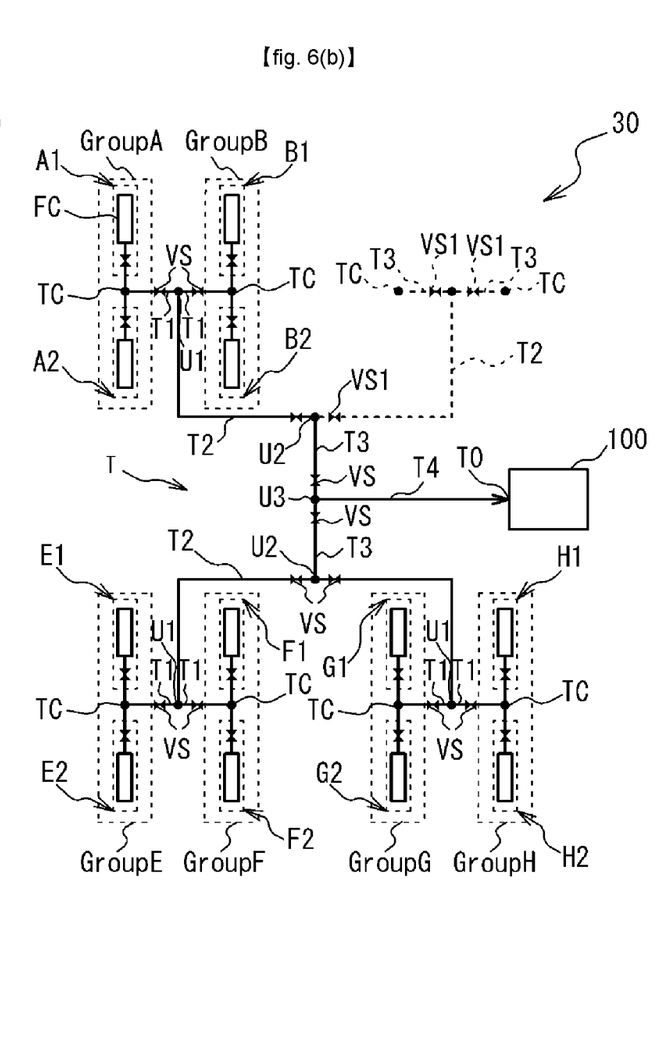

FIG. 6 is a schematic diagram showing an example of flow path switching of another gas supply device 30 according to the present embodiment, in which (a) shows an example of configuration at a development stage, and (b) shows an example of configuration at a mass production stage. Here, "development stage" and "mass production stage" refer to a development stage and a mass production stage of a process equipment employing the gas supply device.

The device at the development stage shown in FIG. 6(a) includes the fluid control units C1 to D2 of the groups C and D in the configuration, but in the device at the mass production stage shown in FIG. 6(b), the fluid control units C1 to D2 of the groups C and D are omitted. In this case, if the piping system at the development stage is diverted to the device at the mass production stage, the part (indicated by the broken line) connected to the groups C, D becomes the cecum piping.

However, in the gas supply device 30 of the present embodiment, by closing the open-close valve VS1 provided in the vicinity of the upstream side of the merging portion U2 where the flow paths from the groups C and D join the flow paths from the groups A and B, the portion connected to the groups C and D (indicated by a broken line) can be isolated from other portions, preventing the generation of cecum piping.

As described above, when the gas supply device 30 of the present embodiment is adopted in a process equipment, even if some of the fluid control units included in the development stage is deleted in the mass production stage, the piping system of the gas supply device 30 can be used as it is in the equipment at the mass production stage while preventing the problem of cecum piping, and thus, it is possible to reduce development costs for design modifications and the like of the piping system.

The present invention is not limited to the above-described embodiments. Various additions, modifications, and the like can be made by those skilled in the art within the scope of the present disclosure.

REFERENCE SIGNS LIST 1, 10, 20, 30: Gas supply device
100: Processing chamber
A1 to H6: Fluid control unit
CH: Flow path
Cp: Flow path
FC: Flow rate controller
G: Process gas
J: Merging piping
JC: Connecting portion (of merging pipe J)
K1: Gas outlet portion
LC1, LC2, RC1, RC2: Connecting portion
M: Main flow path
MHC1, MHC2: Merging flow path
P1, P2: Connecting flow path
PG: Purge gas
R: Merging portion
T: Tournament-like connecting flow path
TC: Inlet
T1: First stage partial flow path
T2: Second stage partial flow path
TO: Outlet
U1, U2, U3: Merging portion
V1: Open-close valve
V2: Open-close valve
Vp: Open-close valve
VS: Open-close valve

The invention claimed is:

1. A gas supply device comprising:
a plurality of fluid control units each including a flow path through which a gas flows from an upstream side to a downstream side, and a fluid control device which is provided in the middle of the flow path and controls a flow of gas flowing through the flow path;
a merging flow path including a plurality of connecting portions fluidly connected to the plurality of fluid control units, and a single gas outlet portion that leads out the gas introduced through the plurality of connecting portions;
wherein the plurality of flow paths is arranged symmetrically with respect to the gas outlet portion in the flow path direction of the merging flow path, and two or more of the fluid control units are fluidly connected to each of the plurality of connecting portions, and
wherein the merging flow path has open-close valves provided in the vicinities of both sides of the gas outlet portion, respectively, and is configured so that the upstream side of each open-close valve can be isolated from other portions.

2. The gas supply device according to claim 1, wherein the plurality of connecting portions is provided in the same plural number on one side and the other side of the gas outlet portion, respectively, in flow path direction of the merging flow path.

3. A semiconductor manufacturing apparatus using the gas supply device as defined in claim 1 for controlling supply of a process gas in a manufacturing process of a semiconductor device, that requires a process step by the process gas in a sealed processing chamber.

4. A gas supply device comprising:
- a plurality of fluid control units each including a flow path through which gas flows from an upstream side to a downstream side, and a fluid control device which is provided in the middle of the flow path and controls a flow of gas flowing through the flow path;
- a connecting flow path that is fluidly connected to the plurality of fluid control units, introduces a gas discharged from the plurality of fluid control units, merges the gas in a tournament shape, and discharges the gas to the outside; and
- the connecting flow path comprising:
- $2^N$ of first stage partial flow paths (N is an integer equal to or greater than 2) each having an inlet connectable to the fluid control unit;
- k-th stage partial flow paths each formed by merging two k-1 stage partial flow paths (k is an integer from 2 to N);
- a (N+1)-th stage partial flow path formed by merging the N-th stage partial flow paths and having an outlet for outputting the gases to the outside;
- wherein flow path lengths or internal volumes of flow paths from the inlets to the outlet of the connecting flow path are equal to or substantially equal to each other, and
- wherein the connecting flow path has open-close valves provided in the vicinities of respective upstream sides of a point where two of the k-th stage partial flow paths (k is an integer of 1 to) merge, and is configured to isolate the upstream sides of the valves from other portions.

5. The gas supply device according to claim 4, wherein one or a plurality of the fluid control units are directly connected to the respective gas inlet ports of the connecting flow path, or the plurality of the fluid control units are connected via a merging pipe that fluidly connects downstream sides of the fluid control units to each other.

* * * * *